United States Patent
Morioka et al.

(10) Patent No.: US 9,405,318 B2
(45) Date of Patent: Aug. 2, 2016

(54) TRANSLUCENT PANEL ATTACHMENT STRUCTURE AND PORTABLE ELECTRONIC DEVICE

(71) Applicant: KYOCERA Corporation, Fushimi-ku, Kyoto-shi, Kyoto (JP)

(72) Inventors: Norikazu Morioka, Katano (JP); Shohei Iwamoto, Daito (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 14/388,696

(22) PCT Filed: Mar. 12, 2013

(86) PCT No.: PCT/JP2013/056748
§ 371 (c)(1),
(2) Date: Sep. 26, 2014

(87) PCT Pub. No.: WO2013/146225
PCT Pub. Date: Oct. 3, 2013

(65) Prior Publication Data
US 2015/0016036 A1    Jan. 15, 2015

(30) Foreign Application Priority Data
Mar. 28, 2012   (JP) .................. 2012-073292

(51) Int. Cl.
*G06F 1/16*    (2006.01)
*H04M 1/02*    (2006.01)
(Continued)

(52) U.S. Cl.
CPC ............ *G06F 1/1626* (2013.01); *G06F 1/1643* (2013.01); *H04M 1/0266* (2013.01); *H04M 1/18* (2013.01); *H05K 5/0086* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,116,774 A | * | 9/2000 | Sasaki | C08G 18/672 156/334 |
| 7,158,376 B2 | * | 1/2007 | Richardson | G06F 1/1626 361/679.56 |
| 7,545,459 B2 | * | 6/2009 | Fujiwara | H04M 1/035 349/58 |

(Continued)

FOREIGN PATENT DOCUMENTS

| | | |
|---|---|---|
| JP | 54-054677 A | 5/1979 |
| JP | 05-165013 A | 6/1993 |

(Continued)

OTHER PUBLICATIONS

International Search Report dated May 30, 2013 issued in International application No. PCT/JP2013/056748.

*Primary Examiner* — Lisa Lea Edmonds
(74) *Attorney, Agent, or Firm* — Procopio, Cory, Hargreaves & Savitch LLP

(57) ABSTRACT

A translucent panel attachment structure according to an embodiment of the present invention includes a translucent panel, a casing, and a silicone resin layer. The casing has an opening into which the translucent panel is fitted. The opening has an inner wall surface which faces a peripheral surface of the translucent panel and an inner bottom surface which inwardly extends from the inner wall surface so as to face a peripheral edge of a back surface of the translucent panel. The silicone resin layer is formed by filling a silicone resin between the peripheral surface of the translucent panel and the inner wall surface of the casing and between the peripheral edge of the back surface of the translucent panel and the inner bottom surface of the casing.

2 Claims, 4 Drawing Sheets

(51) Int. Cl.
*H04M 1/18* (2006.01)
*H05K 5/00* (2006.01)

(56) References Cited

U.S. PATENT DOCUMENTS

| | | | | |
|---|---|---|---|---|
| 8,305,744 B2 * | 11/2012 | Shedletsky | ............ | F16F 7/1028 248/685 |
| 8,794,824 B2 * | 8/2014 | Hirayama | ............ | G04B 37/084 368/294 |
| 2008/0081679 A1 * | 4/2008 | Kawasaki | ............ | H04B 1/3888 455/575.8 |
| 2012/0075964 A1 * | 3/2012 | Hirayama | ............ | G04B 37/084 368/281 |
| 2013/0342970 A1 * | 12/2013 | Franklin | ............... | G06F 1/1643 361/679.01 |

FOREIGN PATENT DOCUMENTS

| | | |
|---|---|---|
| JP | 10-251602 A | 9/1998 |
| JP | 11-118960 A | 4/1999 |
| JP | 2001-021671 A | 1/2001 |
| JP | 2002-366046 A | 12/2002 |
| JP | 2006-276623 A | 10/2006 |
| JP | 2007-304390 A | 11/2007 |
| JP | 2010-117638 A | 5/2010 |

* cited by examiner

TRANSLUCENT PANEL ATTACHMENT STRUCTURE AND PORTABLE ELECTRONIC DEVICE

TECHNICAL FIELD

The present invention relates to a translucent panel attachment structure and a portable electronic device having the attachment structure.

BACKGROUND ART

In a portable electronic device such as a mobile phone and a smartphone, in order to protect a touch panel and a display surface both of which are arranged inside a casing, a translucent panel such as glass is attached to an opening formed on the casing. A peripheral surface of the translucent panel is surrounded by the casing like a frame.

In the casing, an inner bottom surface extends inward from a lower end of an inner wall surface which forms the opening. The translucent panel is attached to the casing by sticking a peripheral edge of a back surface of the translucent panel to the inner bottom surface of the casing with a double-sided tape.

In order to ensure the adhesion of the translucent panel by the double-sided tape and the waterproofness between the translucent panel and the inner bottom surface of the casing, the protruding width of the inner bottom surface is required to be larger than 2 mm over the entire circumference thereof.

As a result, an ineffective area having a width of at least 2 mm or more is formed on the peripheral edge of the translucent panel. In the ineffective area, the operation and visual recognition of the touch panel and the display surface cannot be performed. Therefore, a large ineffective area has to be formed in proportion to the effective area in the translucent panel in which the operation and visual recognition can be performed, which leads to an increase in the size of the portable electronic device and an increase in the size and weight of the translucent panel. Accordingly, the design quality of the portable electronic device may be deteriorated due to the increase in the size thereof.

Further, as a result of the increase in the size of the translucent panel, the casing itself which supports the translucent panel is required to have a sufficient strength. Therefore, the frame part which surrounds the peripheral surface of the translucent panel is made wider. As a result, the size of the portable electronic device increases, and the design quality thereof is thereby deteriorated.

Therefore, a translucent panel attachment structure that is capable of reducing the ineffective area in a translucent panel in which the operation and visual recognition cannot be performed and reducing the width of a frame part and a portable electronic device provided with the attachment structure are desired.

SUMMARY OF THE INVENTION

A translucent panel attachment structure according to an aspect of the present invention includes:

a translucent panel;

a casing having an opening into which the translucent panel is fitted, the opening having an inner wall surface facing a peripheral surface of the translucent panel and an inner bottom surface extending inward from the inner wall surface so as to face a peripheral edge of a back surface of the translucent panel; and a silicone resin layer formed by filling a silicone resin between the peripheral surface of the translucent panel and the inner wall surface of the casing and between the peripheral edge of the back surface of the translucent panel and the inner bottom surface of the casing.

DETAILED DESCRIPTION OF EMBODIMENT

Hereinafter, an embodiment of the present invention will be described with reference to the drawings.

Examples of a portable electronic device 10 to which the present invention can be applied include a mobile phone, a smartphone, a tablet type computer, a portable music player, and a notebook personal computer. The illustrated portable electronic device 10 houses therein a touch panel 14 and a display surface 12 as described below. However, the touch panel 14 or the display surface 12 may not be necessarily provided.

Figure 1:
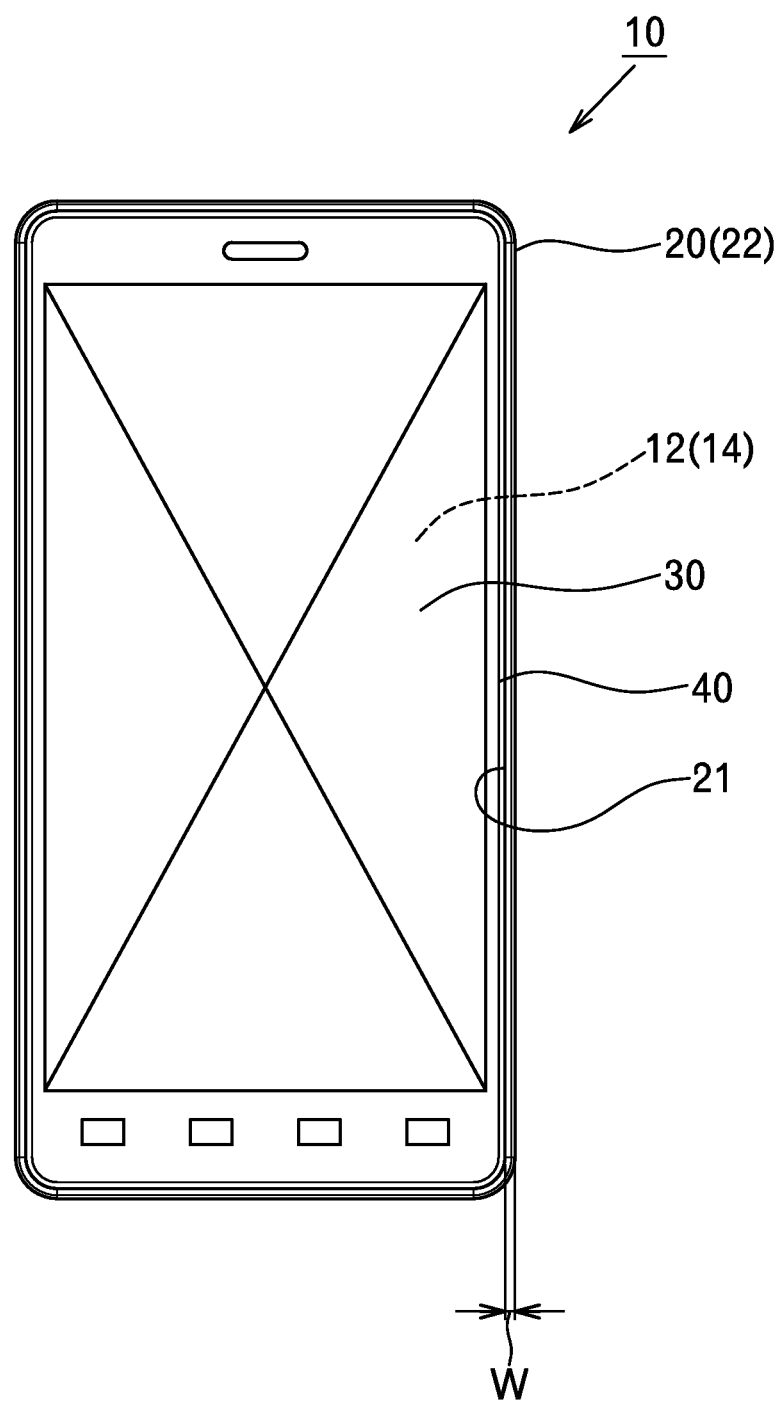
FIG. 1 is a front view of a portable electronic device according to an embodiment of the present invention when viewed from the side of a translucent panel.
Figure 2:
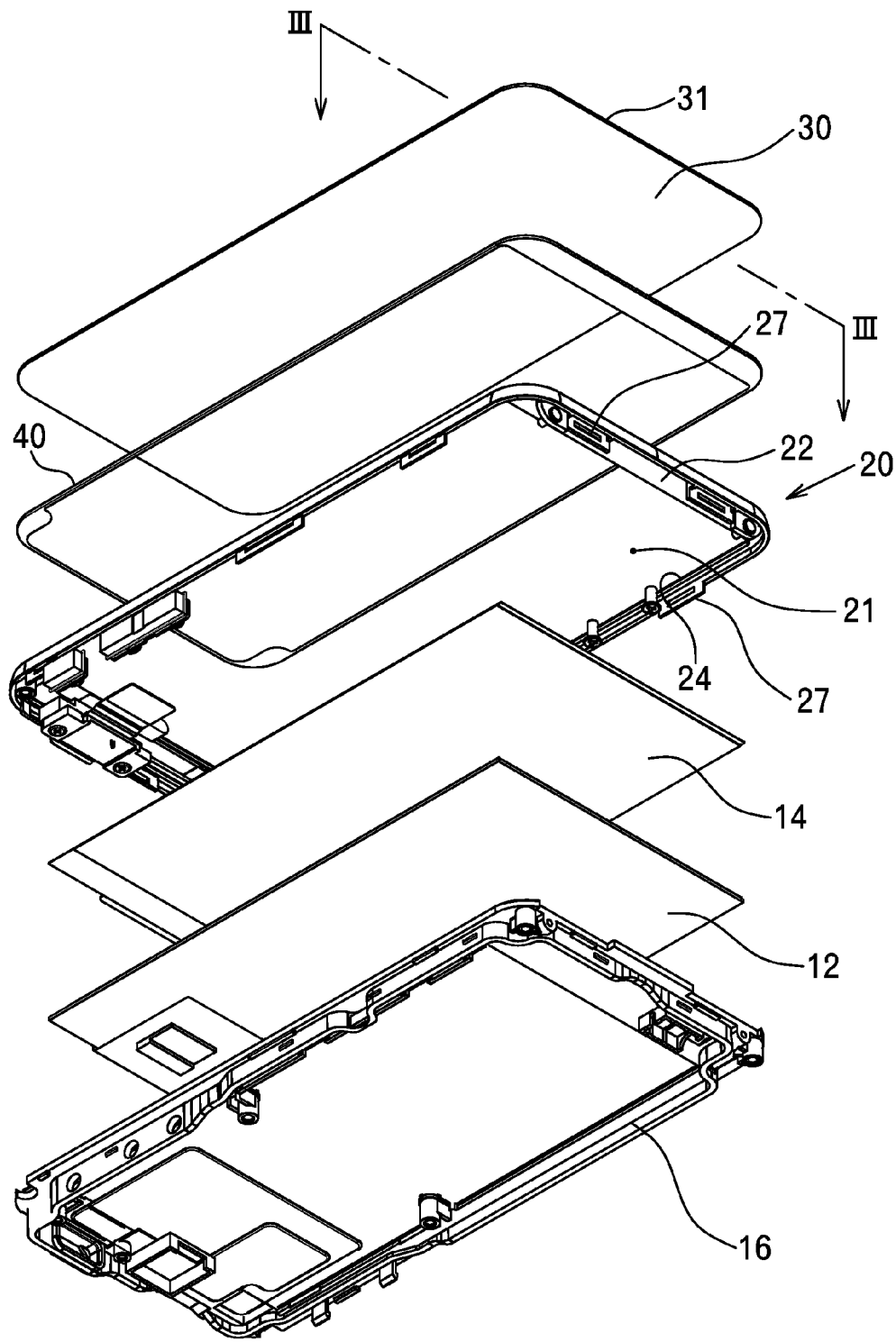
FIG. 2 is an exploded view of a principal part of the portable electronic device according to the embodiment of the present invention.
Figure 3:
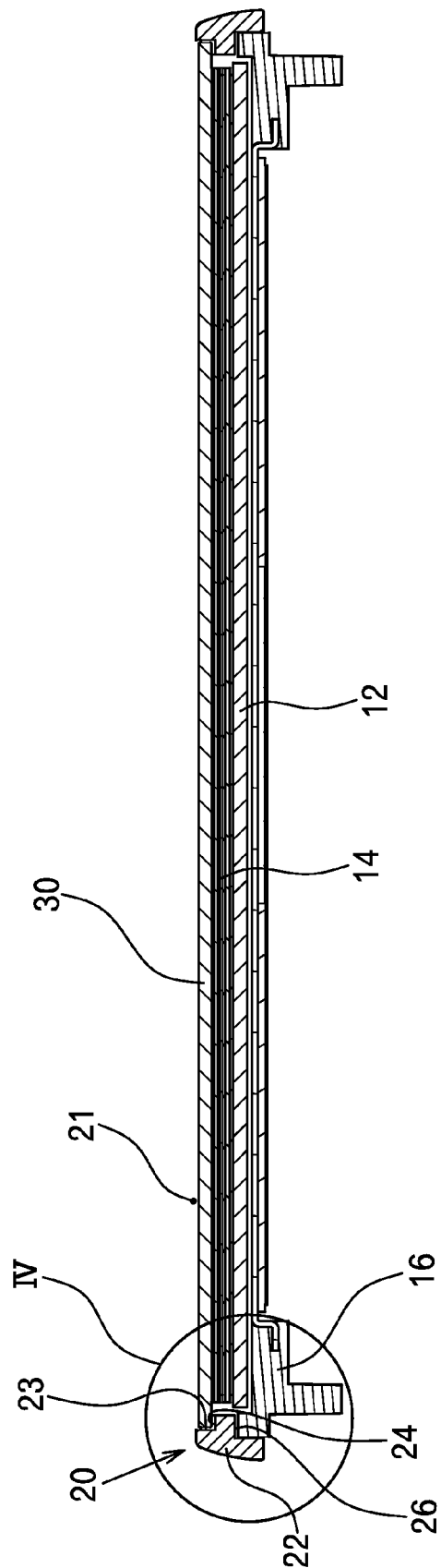
FIG. 3 is a cross-sectional view taken along line III-III of FIG. 2.
Figure 4:
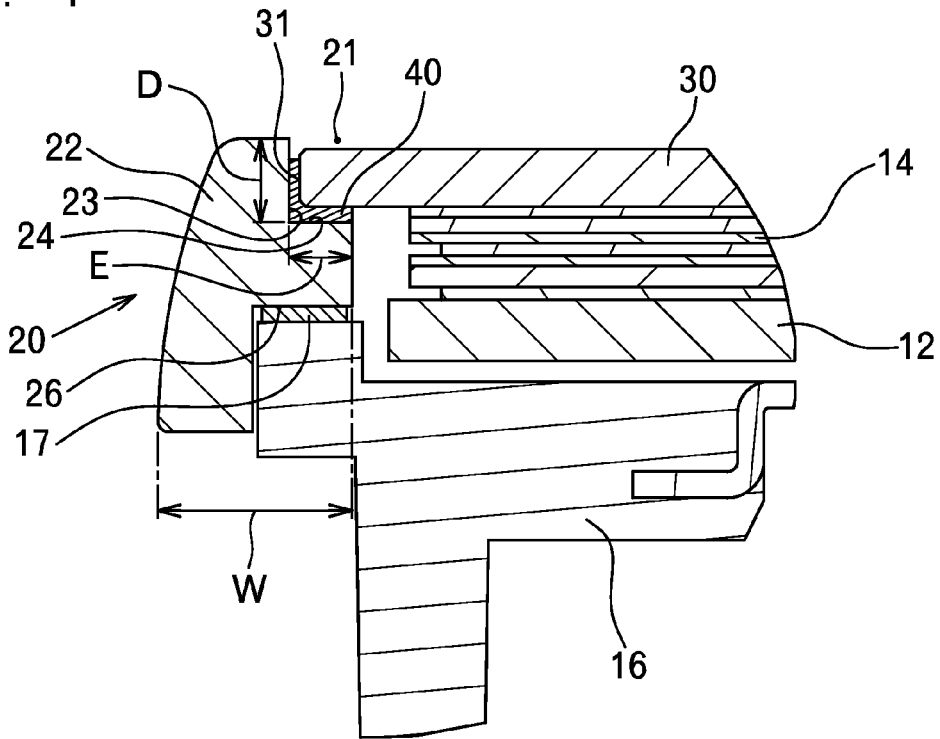
FIG. 4 is an enlarged view of a part of the portable electronic device, the part being indicated by circle IV of FIG. 3.

FIG. 1 is a front view illustrating an embodiment of the portable electronic device 10. FIGS. 2 to 4 are respectively an exploded perspective view, a cross-sectional view, and an enlarged view each illustrating the structure of a part of the portable electronic device 10 according to the embodiment of the present invention, the part being located on the front side (the same side as a translucent panel 30) with respect to the display surface 12.

As illustrated in FIGS. 2 and 3, the portable electronic device 10 according to the present embodiment includes a front casing 20 as sheathing, a silicone resin layer 40, and the translucent panel 30 which is attached to the front casing 20 with the silicone resin layer 40 interposed therebetween. The touch panel 14, the display surface 12, and an inner chassis 16 are attached to the back surface of the translucent panel 30. Although not illustrated, on the back surface side of the inner chassis 16, a control board which controls the portable electronic device 10, a battery, and electronic components required for communication, speech, and the like are housed and covered by a back casing.

The front casing 20 (corresponding to "casing" in the present invention) is a rectangle frame 22 which has an opening 21 formed on the front side. The translucent panel 30 is attached to the opening 21. The front casing 20 serves as a frame part which supports the translucent panel 30, and also surrounds and thereby protects a peripheral surface 31 of the translucent panel 30.

A resin injection-molded article such as plastic can be employed as the front casing 20. Coating or mirror surface finishing can be previously applied to the front casing 20. Further, coating or mirror surface finishing may also be applied to the front casing 20 after attaching the translucent panel 30 thereto.

As illustrated in the enlarged view of FIG. 4, the front casing 20 has an inner wall surface 23 which is formed from a front surface of the frame 22 toward a back surface thereof and an inner bottom surface 24 which is formed on the lower end of the inner wall surface 23 so as to extend inward from the inner wall surface 23 to form the opening 21 to which the translucent panel 30 is attached.

The height D of the inner wall surface 23, that is, the depth from the front surface of the frame 22 to the inner bottom surface 24 is defined by the thickness of the translucent panel 30 attached thereto and the thickness of the silicone resin layer 40 (described below), and can be set approximately equal to the sum of these thicknesses.

Further, the protruding width E of the inner bottom surface 24 is set to a width required for integrating therewith the translucent panel 30 with the silicone resin layer 40 and undetachably holding the translucent panel 30. The protruding width E is appropriately equal to or less than 2 mm, and is desirably approximately 0.5 mm to 1 mm.

As illustrated in FIG. 4, the front casing 20 has a chassis attachment surface 26 which is formed on the back side of the inner bottom surface 24. The inner chassis 16 is joined to the chassis attachment surface 26 with adhesive 17 or the like.

In addition, one or more attachment members 27 (see FIG. 2) for connecting the front casing 20 to the back casing are formed in the front casing 20.

The translucent panel 30 which is attached to the opening 21 of the front casing 20 is a light transmissive panel. Examples of the translucent panel 30 include a glass panel and a resin panel. The translucent panel 30 serves as a protection member for the display surface 12 and the touch panel 14 both of which are housed inside the front casing 20. Protection coating can be applied onto the front surface and/or the back surface of the translucent panel 30 as needed.

The shape of the translucent panel 30 is defined corresponding to the opening 21. When the opening 21 has a substantially rectangular shape, the shape of the peripheral surface 31 of the translucent panel 30 is also formed in a substantially rectangular shape. As will be described below, in order to integrate the translucent panel 30 with the front casing 20 with the silicone resin layer 40, the translucent panel 30 is formed to have a size and a thickness which are respectively smaller than the size and the thickness of the opening 21 by the thickness of the silicone resin layer 40.

Further, primer coating is desirably applied onto the peripheral surface 31 and the peripheral edge of the back surface of the translucent panel 30 to which a silicone resin is joined in order to improve the adhesion with the silicone resin.

The front casing 20 and the translucent panel 30 having the above configuration are integrally joined to each other with a silicone resin such as a silicone rubber.

Figure 5:
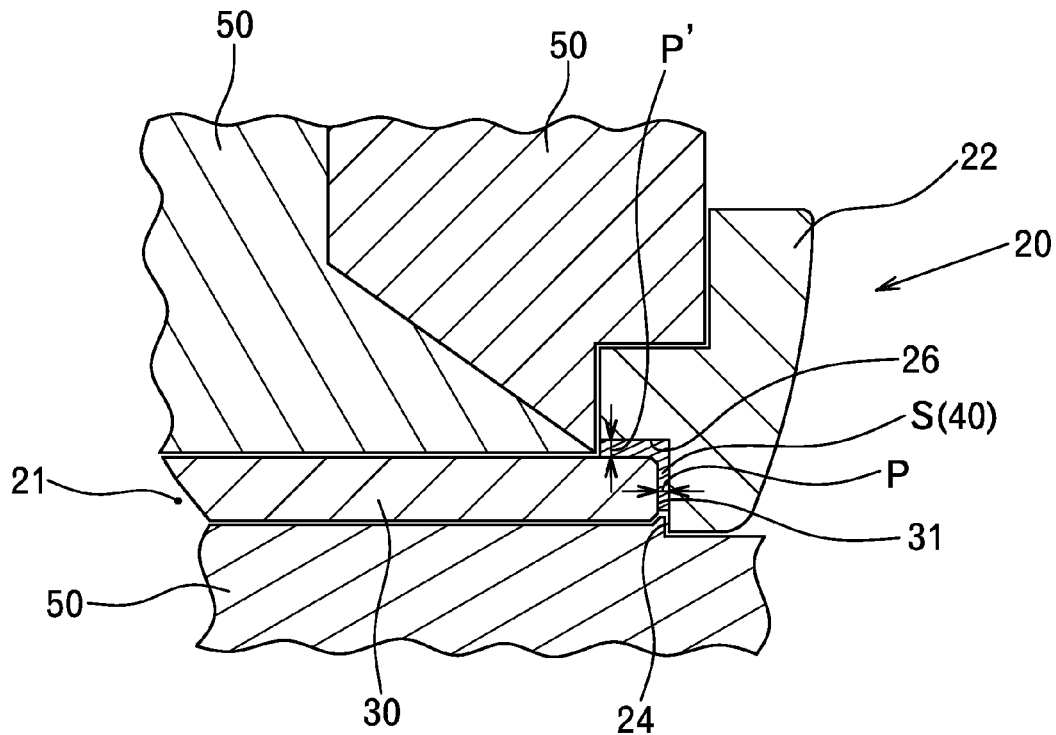
FIG. 5 is an enlarged view illustrating an embodiment of a step for pouring a silicone resin between a casing and the translucent panel.

FIG. 5 illustrates an embodiment of molds 50, 50 which are used for filling a silicone resin between the front casing 20 and the translucent panel 30.

As illustrated in the figure, the front casing 20 and the translucent panel 30 are attached to the injection molds 50, 50 with a space P between the inner wall surface 23 of the front casing 20 and the peripheral surface 31 of the translucent panel 30 and a space P' between the inner bottom surface 24 of the front casing 20 and the peripheral edge of the back surface of the translucent panel 30. In such a state, a liquid silicone resin S is poured into the spaces P, P' from a gate (not illustrated), and then cooled. Accordingly, the silicone resin is cured to form the silicone resin layer 40, thereby making it possible to attach the translucent panel 30 to the front casing 20.

The thickness of the silicone resin layer 40 is appropriately adjusted depending on the size of the opening 21, the protruding width E of the inner bottom surface 24, the weight and the thickness of the translucent panel 30, and the like. In the illustrated embodiment, the thickness of the silicone resin is approximately 0.1 mm.

As illustrated in FIGS. 2 to 4, the touch panel 14 and the display surface 12 are attached to the back surface of the translucent panel 30 which is attached to the front casing 20 in the above manner.

Examples of the touch panel 14 include an electrostatic capacitance type touch panel and a resistance film type touch panel. However, the touch panel 14 is not limited thereto. In some touch panels, an electrode or an electrode film may be arranged on the translucent panel 30 so as to have functions of both of the translucent panel 30 and a touch panel. In this case, the present invention maybe applied to the translucent panel 30 which also serves as a touch panel.

Similarly, examples of the display surface 12 include a liquid crystal display panel. However, the display surface 12 is not limited thereto.

After the touch panel 14 and the display surface 12 are attached to the translucent panel 30, the inner chassis 16 is bonded to the chassis attachment surface 26 of the front casing 20. Then, necessary electronic components are mounted on the inner chassis 16, and the front casing 20 and the back casing are engaged with each other using the attachment member 27 to thereby obtain the portable electronic device 10.

In the portable electronic device 10 of the present invention, it is possible to reduce the protruding width E of the inner bottom surface 24 of the front casing 20 as much as possible to thereby also reduce the ineffective area in the translucent panel 30 in which the operation and visual recognition cannot be performed, compared to the case where a translucent panel is attached to a front casing with a double-sided tape. Therefore, in the translucent panel 30, a large effective area which faces the touch panel 14 and the display surface 12 can be ensured relative to the ineffective area. Further, since the size of the translucent panel 30 with respect to the touch panel 14 and the display surface 12 can be reduced, downsizing and weight reduction of the translucent panel 30 can be achieved.

Further, since it is possible to reduce the size of the translucent panel 30, and also reduce the protruding width E of the inner bottom surface 24, also in the front casing 20 which supports the translucent panel 30, the width W of the frame 22 which forms the frame part (see FIGS. 1 and 4) can be reduced. As a result, downsizing and weight reduction of the portable electronic device 10 can be achieved.

Since the width of the frame part of the front casing 20 can be reduced, it is possible to improve the design quality of the portable electronic device 10.

The silicone resin layer 40 which integrates the front casing 20 and the translucent panel 30 with each other is excellent in waterproofness and water repellency. Therefore, it is possible to eliminate the necessity of additional waterproofing between the front casing 20 and the translucent panel 30.

Further, the silicone resin layer 40 has moderate elasticity even after being cured. Therefore, the silicone resin layer 40 serves as a cushion material for the translucent panel 30. Therefore, it is possible to provide excellent strength against stress from the lateral side which is caused, for example, when the portable electronic device 10 is accidentally dropped.

The present invention is effective as a translucent panel attachment structure capable of reducing the ineffective area in a translucent panel in which the operation and visual recognition cannot be performed and reducing the width of a frame part, and a portable electronic device provided with the attachment structure.

DESCRIPTION OF REFERENCE CHARACTERS

10 portable electronic device
12 display surface
14 touch panel
16 inner chassis
20 front casing (casing)
21 opening
23 inner wall surface
24 inner bottom surface
30 translucent panel
40 silicone resin layer

What is claimed is:

1. A translucent panel attachment structure comprising:
   a translucent panel;
   a casing having an opening into which the translucent panel is fitted, the opening having an inner wall surface facing a peripheral surface of the translucent panel and an inner bottom surface extending inward from the inner wall surface so as to face a peripheral edge of a back surface of the translucent panel; and
   a silicone resin layer formed by filling a silicone resin between the peripheral surface of the translucent panel and the inner wall surface of the casing and between the peripheral edge of the back surface of the translucent panel and the inner bottom surface of the casing after the translucent panel is positioned in said opening of the casing and curing the liquid silicone resin by cooling.

2. A portable electronic device comprising the translucent panel attachment structure according to claim 1.

* * * * *